United States Patent
Herman et al.

(10) Patent No.: US 8,686,412 B2
(45) Date of Patent: Apr. 1, 2014

(54) MICROELECTRONIC DEVICE

(75) Inventors: Gregory Herman, Albany, OR (US);
Benjamin Clark, Corvallis, OR (US);
Zhizhang Chen, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1586 days.

(21) Appl. No.: 11/888,072

(22) Filed: Jul. 31, 2007

(65) Prior Publication Data

US 2009/0032812 A1 Feb. 5, 2009

(51) Int. Cl.
*H01L 29/10* (2006.01)
*H01L 29/12* (2006.01)

(52) U.S. Cl.
USPC ............. 257/43; 438/142; 438/150; 438/151; 257/E21.411

(58) Field of Classification Search
USPC ............ 257/43, E29.151, E21.411, 414, 415; 438/85, 86, 104, 149, 754, 142, 151
See application file for complete search history.

(56) References Cited

U.S. PATENT DOCUMENTS

| | | | |
|---|---|---|---|
| 6,673,643 B2 | 1/2004 | Yamazaki | |
| 7,145,174 B2 | 12/2006 | Chiang | |
| 2001/0008710 A1* | 7/2001 | Takatsuji et al. | 428/689 |
| 2005/0087758 A1 | 4/2005 | Kwak | |
| 2005/0240002 A1* | 10/2005 | Burgoyne et al. | 528/425 |
| 2006/0079034 A1* | 4/2006 | Hoffman et al. | 438/151 |
| 2006/0197092 A1 | 9/2006 | Hoffman | |

OTHER PUBLICATIONS

Christiansen et al, Spin-on Glass, Jun. 2000, pp. 1-7.*
Honeywell, Honeywell Electronic Materials, 2000-2009, p. 1.*

* cited by examiner

*Primary Examiner* — Thao Le
*Assistant Examiner* — Eric Jones

(57) ABSTRACT

A microelectronic device includes a thin film transistor having an oxide semiconductor channel and an organic polymer passivation layer formed on the oxide semiconductor channel.

16 Claims, 1 Drawing Sheet

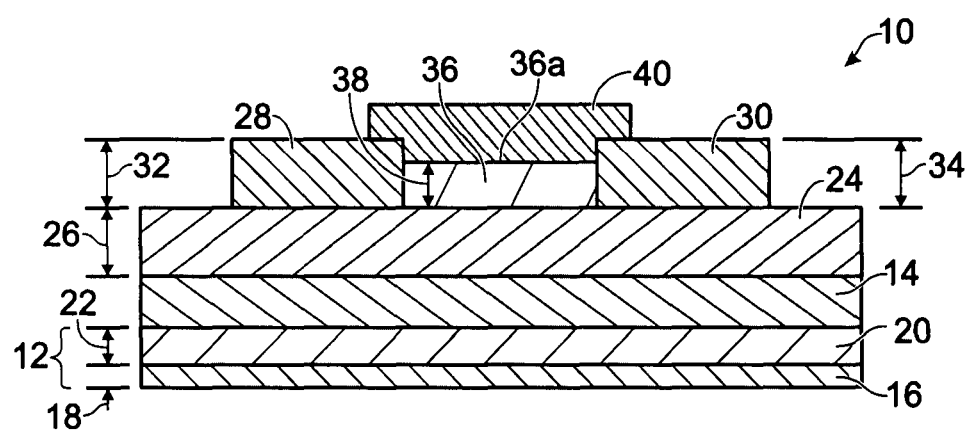

MICROELECTRONIC DEVICE

BACKGROUND

Microelectronic devices, such as thin film transistors (TFTs), may include an oxide semiconductor channel layer. Instability of the oxide semiconductor channel layer may lead to instability of the TFT. Accordingly, there may be a need to provide a TFT including a stabilized oxide semiconductor channel layer.

BRIEF DESCRIPTION OF THE DRAWINGS

FIG. 1 is a schematic side cross-sectional view of one example embodiment of a microelectronic device.

DETAILED DESCRIPTION OF THE DRAWINGS

FIG. 1 is a schematic side cross-sectional view of one example embodiment of a microelectronic device 10. In one example embodiment, device 10 may include an unpatterned gate contact 12 formed on an unpatterned p-type silicon (Si) wafer 14. Gate contact 12 may be manufactured of titanium and gold (Ti/Au) wherein the titanium region 16 has a thickness 18 of 10 nanometers (nm) and the gold region 20 has a thickness 22 of 300 nm, for example. Silicon wafer 14 may be a 150 millimeter (mm) p-type silicon wafer which may function as the TFT gate, for example. The gate contact 12 may be formed on wafer 14 utilizing backside processing techniques.

Silicon wafer 14 may include an unpatterned gate dielectric 24 formed thereon. Gate dielectric 24 may be manufactured of $SiO_2$, for example, and may have a thickness 26 of 100 nm, with a range of thicknesses between 50 nm to 500 nm. Gate dielectric 24 may be formed on wafer 14 utilizing frontside processing techniques. Other gate dielectric materials include $Al_2O_3$, $HfO_2$, $Y_2O_3$, $ZrO_2$, $Ta_2O_5$, $TiO_2$, $Nb_2O_5$, and the like.

Device 10 may further include a source 28 and a drain 30 each formed on gate dielectric 24. Both source 28 and drain 30 may be manufactured of indium tin oxide (ITO), for example, and may each have a thickness 32 and 34, respectively, of about 200 nm. Other materials may be utilized to form source 28 and/or drain 30, such as zinc oxide, aluminum doped zinc oxide, gallium doped zinc oxide, zinc indium oxide, tin oxide, fluorine doped tin oxide, and the like.

Device 10 may further include a channel 36 having a thickness 38 of about 50 nm, which may be manufactured of an oxide semiconductor, and which may operatively connect source 28 and drain 30. Oxide semiconductor channel 36 may be manufactured of zinc oxide, tin oxide, indium oxide, gallium oxide, zinc indium oxide, indium gallium oxide, zinc tin oxide, zinc indium gallium oxide, and any combination thereof, for example. In one example embodiment the oxide semiconductor channel 36 may define an oxide with cations selected from at least one of Zn, In, Ga, and Sn.

In one example manufacturing process, the source 28 and drain 30 electrodes are formed on gate dielectric 24 by RF sputtering and lift-off photolithographic patterning to define desired lateral dimensions, as suitable for the device or circuit being fabricated. In the example embodiment shown, source 28 and drain 30 each define respectively, a thickness 32 and 34 of approximately 200 nm.

An oxide semiconductor channel 36 of zinc indium oxide (ZIO) is then formed by rf sputtering with a target composition of $ZnIn_4O_7$ to a thickness 38 of approximately 50 nm and lift-off or etch photolithographic patterning to define desired lateral dimensions, as suitable for the device or circuit being fabricated. In the example embodiment the zinc indium oxide semiconductor channel 36 is formed in an Argon/Oxygen atmosphere having a ratio of 90 Argon to 10 Oxygen ($Ar:O_2$ 90:10) for a time of at least two minutes, at an energy level of at least 140 Watts, and at a pressure of at least 7 mTorr. The entire device 10 is then annealed in air at a temperature of at least fifty degrees Celsius, and up to approximately 200 degrees Celsius (C) for sixty minutes, with a ramp up and a ramp down temperature gradient of two degrees Celsius per minute to reach the temperature of 200 degrees Celsius, for example. This process results in channel 36 formed between and operatively connecting source 28 and drain 30.

It has been observed in TFT devices manufactured using this process that a high channel conductivity is induced within the semiconductor channel after photolithographic patterning of the channel. In addition, use of poly (4-vinyl phenol) as a dielectric has also resulted in overly conductive channels. Applicants have found that formation of a passivation layer 40 on channel 36 reduces and may even eliminate such high conductivity issues.

Accordingly, in one example embodiment, after formation of channel layer 36, an organic polymer passivation layer 40 is then formed on an exposed surface 36a of the zinc indium oxide semiconductor channel 36. Organic polymer passivation layer 40 may be a photoresist, SU8, and/or an organic resin, for example. Passivation layer 40 may be formed on channel layer 36 by spin coating the resist, followed by softbaking the substrate to drive off casting solvents. Softbake temperatures are on the order of 60-95° C. for 5-15 minutes, depending on thickness of the passivation layer. A typical softbake process for a 4 um thick SU8 films will be multi-staged, 60° C. for 1 minute, followed by 95° for 2 minutes. Alternatively, one could laminate a dry film of SU8 onto the substrate, which would negate the need for a softbake since there are no casting solvents in the dry film. After spin coating or dry film lamination, the passivation layer is patterned via UV exposure followed by develop of the unexposed regions (assuming negative resists, like SU8; positive resist will become more soluble after UV exposure) with a suitable solvent (ethyl lactate in the case of SU8, will remove unexposed regions. In the case of positive photo resist, TMAH will remove exposed regions).

After formation of passivation layer 40, device 10 may be subjected to a second anneal step, which may also be referred to as a cure step, of passivation layer 40. The curing of passivation layer 40, such as SU8, for example, may include annealing device 10 in air at a temperature in a range of approximately 90 to 225 degrees C., and more particularly at a temperature of 175 degrees C., for 30 minutes, with a ramp up and a ramp down temperature gradient of two degrees Celsius per minute to reach the temperature of 175 degrees Celsius, for example. This curing step may result in crosslinking of the individual organic polymers of the SU8 passivation layer 40, which may render the device more robust to subsequent processing.

The inclusion of the passivation layer 40 into device 10 has been found to effectively reduce the otherwise observed high channel conductivity induced within the semiconductor channel 36 after sputter deposition of materials onto channel 36. Accordingly, a device 10 manufactured according to the present method has excellent on-to-off ratios and allows control of the turn-on voltage of the device 10. In particular, after formation of passivation layer 40, the oxide semiconductor channel layer 36 defines a channel conductance of effectively zero at a turn-on voltage of the thin film transistor, wherein a channel conductance of "effectively zero" is defined as a channel sheet resistance greater than or equal to about $10^8$ Ohms/square. In the case where the TFT semiconductor channel layer 36 contains a non-zero equilibrium (i.e., in the absence of external influence such as the application of a non-zero gate voltage) population of free electrons, a channel conductance of "effectively zero" may be achieved when the TFT channel is effectively depleted of any equilibrium population of free electrons with the application of a suitable negative gate voltage, such as a voltage in a range of negative fifteen to zero volts. In other words, use of passivation layer 40 within device 10 allows channel 36 to remain nonconductive until an appropriate gate bias is applied.

In consumer electronics applications, for example, inclusion of passivation layer 40 within device 10 may passivate the channel 36 for stability with respect to exposure to various atmospheric conditions such as extreme temperatures, pressure, light and the like, while providing a device 10 that performs essentially the same as a device without a passivation layer 40. In other words, inclusion of passivation layer 40 reduces conductivity issues of device 10 while still allowing acceptable transfer characteristics of channel 36 to occur. In particular, the passivation layer 40 can protect the channel layer 36 during further processing of the device/circuit to minimize the effects of extreme temperatures, pressure, light and the like, and to prevent a high channel conductivity.

Inclusion of passivation layer 40 in a TFT device 10 may allow flexibility in integrating the TFT into a more complex system, such as an organic light emitting diode (OLED), a light emitting diode (LED) and/or a post aligned bistable nematic (PABN) liquid crystal display (LCD) display. Moreover, passivation layer 40 may allow process flexibility because subsequent processing steps may be undertaken without damaging the channel layer 36 which is protected by passivation layer 40.

In addition to providing passivation of channel 36, passivation layer 40 may define a protective coating that protects the oxide semiconductor layer 36 during further processing, such as during wet etch patterning. In one example test, a first sample device was photo processed including a passivation layer 40 and a second sample device was photo processed without including a passivation layer 40. X-ray photoelectron spectroscopy (XPS) testing on the devices showed that the second, unprotected device included an indium (In) concentration richer within the uppermost region of channel 36 (e.g., to a depth of approximately 2.5 nm below exposed surface 36a) when compared to the first, protected device. The differences in the In rich concentration within the uppermost region of the channels 36 of two devices explains why the TFT device with no passivation layer 40 exhibited high channel conductance while the passivated TFT device showed low channel conductance.

Passivation layer 40 may also define an interlayer dielectric on channel 36. For example, the passivation layer 40 can be patterned in such a way as to act like an interlayer dielectric. In particular, passivation layer 40 can be patterned such that vias to the source 28 and drain 30 are formed while allowing other portions of device 10 to be covered with passivation layer 40

Accordingly, test results have shown that a zinc indium oxide channel layer 36, for example, may become conductive if an exposed surface 36a is exposed to a photoresist strip bath, polyvinyl phenol processing, and/or copper zinc oxide sputtering. However, as shown in one example embodiment, providing a passivation layer 40, such as an SU8 passivation layer 40 on an exposed surface 36a of a zinc indium oxide channel layer 36 may result in a much more stable TFT device 10. Use of a passivation layer 40, such as a passivation layer of SU8, for example, may also reduce or eliminate one photo process step because the zinc indium oxide patterning step and the passivation step may be combined into a single photo step.

Other variations and modifications of the concepts described herein may be utilized and fall within the scope of the claims below.

We claim:

1. A microelectronic device, comprising:
a thin film transistor including a zinc indium oxide semiconductor channel; and
an organic polymer passivation layer formed on said zinc indium oxide semiconductor channel.

2. The device of claim 1 wherein said organic polymer is chosen from one of a photoresist, SU8, and an organic resin.

3. The device of claim 1 wherein said zinc indium oxide semiconductor channel defines a channel conductance of effectively zero at a turn-on voltage of the thin film transistor.

4. The device of claim 3 wherein said turn-on voltage is a gate voltage in a range of negative fifteen to positive fifteen volts.

5. The device of claim 3 wherein said channel conductance of effectively zero is defined as a channel sheet resistance of not less than $10^8$ Ohms Square.

6. The device of claim 1 wherein said thin film transistor further comprises a source and a drain, wherein said semiconductor channel operatively connects said source and said drain, and wherein said source, said drain and said semiconductor channel are formed on a gate dielectric.

7. The device of claim 1 wherein said passivation layer defines a protective coating that protects said zinc indium oxide semiconductor layer during processing.

8. The device of claim 1 wherein said passivation layer defines an interlayer dielectric.

9. A method of making a thin film transistor, comprising:
forming a zinc indium oxide semiconductor channel; and
forming an organic polymer passivation layer on said zinc indium oxide semiconductor channel.

10. The method of claim 9 further comprising further processing said thin film transistor, wherein said passivation layer protects said zinc indium oxide semiconductor channel from said further processing.

11. The method of claim 9 further comprising, prior to forming said organic polymer, annealing said zinc indium oxide semiconductor channel in air at a temperature of at least 150 degrees Celsius.

12. The method of claim 9 further comprising forming a source and a drain, wherein said zinc indium oxide semiconductor channel connects said source and said drain.

13. The method of claim 9 wherein said zinc indium oxide semiconductor channel is formed on a gate dielectric.

14. The method of claim 9 wherein said zinc indium oxide semiconductor channel is formed in an Argon/Oxygen atmosphere having a ratio of 90 Argon to 10 Oxygen ($Ar:O_2$ 90:10) for a time of at least two minutes, at an energy level of at least 140 Watts, and at a pressure of at least 7 mTorr.

15. The method of claim 9 wherein said zinc indium oxide semiconductor channel defines a thickness of at least 10 nm.

16. The method of claim 9 further comprising curing said organic polymer passivation layer at a temperature of at least 90 degrees Celsius.

* * * * *

UNITED STATES PATENT AND TRADEMARK OFFICE
CERTIFICATE OF CORRECTION

PATENT NO. : 8,686,412 B2
APPLICATION NO. : 11/888072
DATED : April 1, 2014
INVENTOR(S) : Gregory Herman et al.

It is certified that error appears in the above-identified patent and that said Letters Patent is hereby corrected as shown below:

In the Claims

In column 4, line 56, in Claim 14, delete "($Ar:O_2 90:10$)" and insert -- ($Ar:O_2$ 90:10) --, therefor.

Signed and Sealed this
Sixteenth Day of September, 2014

Michelle K. Lee
*Deputy Director of the United States Patent and Trademark Office*